US009056718B2

(12) United States Patent
Ito

(10) Patent No.: US 9,056,718 B2
(45) Date of Patent: Jun. 16, 2015

(54) TRANSFER DEVICE

(75) Inventor: Yasuhisa Ito, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 233 days.

(21) Appl. No.: 13/696,808

(22) PCT Filed: May 13, 2010

(86) PCT No.: PCT/JP2010/003237
§ 371 (c)(1),
(2), (4) Date: Nov. 8, 2012

(87) PCT Pub. No.: WO2011/141966
PCT Pub. Date: Nov. 17, 2011

(65) Prior Publication Data
US 2013/0058742 A1 Mar. 7, 2013

(51) Int. Cl.
B65G 1/133 (2006.01)
B65G 1/04 (2006.01)
H01L 21/677 (2006.01)

(52) U.S. Cl.
CPC ...... *B65G 1/0407* (2013.01); *B65G 2201/0297* (2013.01); *H01L 21/67766* (2013.01); *H01L 21/67769* (2013.01)

(58) Field of Classification Search
CPC ............... G07F 11/165; B65G 1/0407; B65G 2201/0297; H01L 21/67766; H01L 21/67769
USPC ............... 414/281, 282, 749.1, 749.6
See application file for complete search history.

(56) References Cited

U.S. PATENT DOCUMENTS

| | | | |
|---|---|---|---|
| 4,846,620 A * | 7/1989 | Mims | 414/273 |
| 4,964,776 A | 10/1990 | Wakita et al. | |
| 5,064,337 A | 11/1991 | Asakawa et al. | |
| 5,468,110 A * | 11/1995 | McDonald et al. | 414/273 |
| 5,791,512 A * | 8/1998 | Kanatsuka | 221/2 |
| 6,079,927 A * | 6/2000 | Muka | 414/217 |
| 6,506,009 B1 | 1/2003 | Nulman et al. | |
| 6,755,322 B1 * | 6/2004 | Herzog et al. | 221/123 |

(Continued)

FOREIGN PATENT DOCUMENTS

| | | |
|---|---|---|
| JP | 61-92610 U | 6/1986 |
| JP | 01-145906 A | 6/1989 |

(Continued)

OTHER PUBLICATIONS

Official Communication issued in International Patent Application No. PCT/JP2010/003237, mailed on Aug. 3, 2010.

(Continued)

*Primary Examiner* — Saul Rodriguez
*Assistant Examiner* — Mark Hageman
(74) *Attorney, Agent, or Firm* — Keating & Bennett, LLP

(57) ABSTRACT

A transfer device transfers an object stored on one of a plurality of shelf plates of a shelf. The transfer device includes two pillars vertically standing in front of the shelf, an upper rail attached to upper front surfaces of the two pillars so as to tie the two pillars together, a vertical rail provided in a plane including the two pillars and slidably connected to a side surface of the upper rail, a lower rail provided under the vertical rail, attached to lower portions of the two pillars, and connected to the vertical rail in a manner which allows the vertical rail to slide, and a holding unit slidably connected to a side surface of the vertical rail and arranged to detachably hold the object.

9 Claims, 4 Drawing Sheets

(56) References Cited

U.S. PATENT DOCUMENTS

| | | |
|---|---|---|
| 2004/0081546 A1 | 4/2004 | Elliott et al. |
| 2005/0036856 A1 | 2/2005 | Yamashita |
| 2007/0108222 A1* | 5/2007 | Collins et al. ............... 221/251 |
| 2009/0065460 A1 | 3/2009 | Murata et al. |
| 2011/0184751 A1* | 7/2011 | Holmes ......................... 705/2 |

FOREIGN PATENT DOCUMENTS

| | | |
|---|---|---|
| JP | 01-203106 A | 8/1989 |
| JP | 05-338732 A | 12/1993 |
| JP | 10-172213 A | 6/1998 |
| JP | 2001-298069 A | 10/2001 |
| KR | 10-2009-0026099 A | 3/2009 |

OTHER PUBLICATIONS

English translation of Official Communication issued in corresponding International Application PCT/JP2010/003237, mailed on Dec. 13, 2012.

Official Communication issued in corresponding European Patent Application No. 10851352.4, mailed on Aug. 27, 2014.

* cited by examiner

TRANSFER DEVICE

BACKGROUND OF THE INVENTION

1. Field of the Invention

The present invention relates to a transfer device that is preferably provided between a semiconductor manufacturing device and an aisle, and used for a shelf that temporarily stores an object containing a substrate necessary to manufacture a semiconductor and changes a storage area for the object within the shelf.

2. Description of the Related Art

When substrates such as a glass substrate and a silicon substrate are brought from one location to a semiconductor manufacturing device and when processed substrates are carried to another location, a conventional scheme utilizes a box, referred to as a container, to contain multiple substrates and transfers the container. In transferring the container, an overhead transferring vehicle which travels near the ceiling is used to save space in a semiconductor manufacturing factory.

The container has to be temporarily stored, depending on how a preceding process and a supplemental process progress in the manufacturing process of semiconductors. In order to store the container, a shelf for storing the container is provided above a loader and an unloader for the semiconductor manufacturing device. The semiconductor manufacturing device has a transfer device. The transfer device can automatically transfer an appropriate container from the shelf to the loader when the substrates are ready to be processed. The transfer device can also automatically transfer from the unloader to the shelf a container containing processed substrates.

In order to save space, a semiconductor manufacturing factory has semiconductor manufacturing devices on both sides of an aisle across from each other. The loader and the unloader are provided between the semiconductor manufacturing device and the aisle. The transfer device is provided between the loader/unloader and the aisle.

Japanese Unexamined Patent Application Publication No. 2001-298069 discloses a transfer device and a shelf. The shelf in Japanese Unexamined Patent Application Publication No. 2001-298069 has horizontal and vertical aisles so that a container held by the transfer device can move inside the shelf. This structure saves as much space as possible. Moreover, the transfer device has rails each used for moving a holding unit, which holds a container, in the vertical direction and the horizontal direction. The rails are attached to the shelf. This structure provides aisles that are as wide as possible.

As recent substrates are becoming larger, a container for containing the substrates is becoming heavier. Such a trend requires a transfer device to be stiffer.

SUMMARY OF THE INVENTION

Accordingly, preferred embodiments of the present invention provide a transfer device which has sufficient stiffness and maintains a sufficiently wide aisle around the footprint of the transfer device.

A transfer device according to a preferred embodiment of the present invention transfers an object stored on one of a plurality of shelf plates to another one of the shelf plates, the shelf plates being arranged vertically and horizontally and provided to a shelf. The transfer device includes two pillars arranged to vertically stand in front of the shelf; an upper rail which is horizontally attached to upper front surfaces of the two pillars so as to tie the two pillars together; a vertical rail which is vertically and slidably connected to a side surface of the upper rail; a lower rail which is provided under the vertical rail sandwiched between the two pillars to tie the two pillars together such that both ends of the lower rail abut lower portions of the two pillars, and connected to the vertical rail in a manner which allows the vertical rail to slide, the vertical rail being provided in a plane formed in phantom between the two pillars; and a holding unit which projects from the vertical rail to the shelf and is slidably connected to a side surface of the vertical rail, and configured to detachably hold the object, wherein the vertical rail moves in the plane.

This structure allows the upper rail and the lower rail to guide the vertical rail, which contributes to improving stiffness of the transfer device. This structure also makes it possible to disperse a load between the upper rail and the lower rail. Consequently, the upper rail can be made thinner to avoid excessively projecting into the aisle. Furthermore, the lower rail is preferably provided in the same plane as the pillars are. This structure makes it possible to substantially reduce an above-the-ground thickness of the transfer device, which a user can feel when passing by. Consequently, this feature contributes to providing a wider aisle.

Furthermore, the transfer device may preferably include a cover which is provided in front of the two pillars, and covers a moving area of the holding unit, wherein the cover includes an upper cover which covers the upper rail, and a lower cover which is provided behind the upper cover and covers a lower portion of the moving area.

The upper rail may preferably include a horizontal driving unit configured to horizontally drive the vertical rail, and the lower rail may not include the horizontal driving unit.

This structure makes it possible to use a thin lower rail for the transfer device, which contributes to providing a wider aisle.

The vertical rail may include a vertical driving unit which is attached to a side surface at an upper end of the vertical rail, and vertically drives the holding unit, and the upper rail may be provided below the vertical driving unit.

This structure makes it possible to keep a space wide over the transfer device, which contributes to easily preventing interference of the transfer device with the object held by the overhead traveling vehicle.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will described with reference to the drawings.

Figure 1:
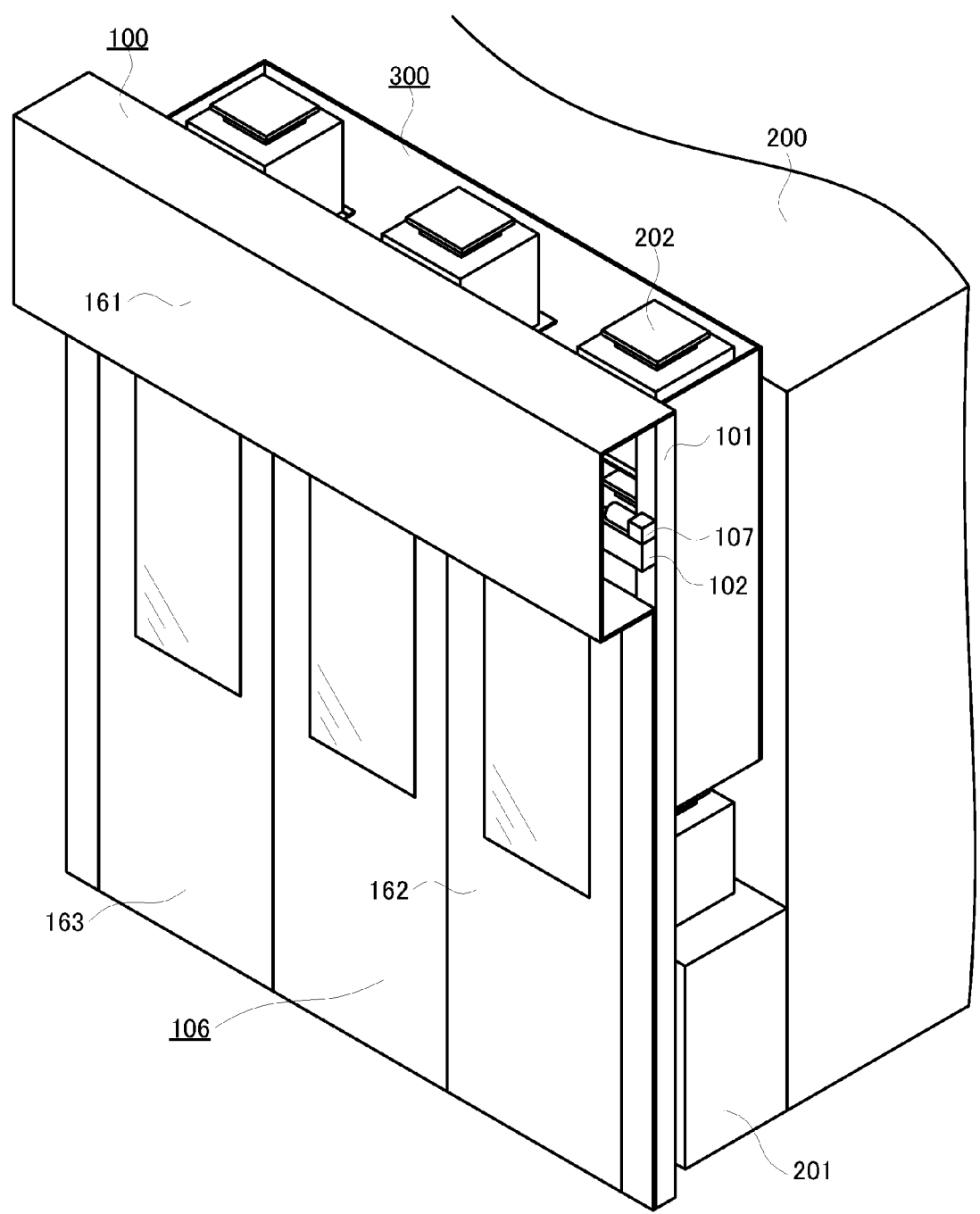
FIG. 1 depicts a perspective view showing a transfer device as a whole.

FIG. 1 depicts a perspective view showing a transfer device as a whole.

Figure 2:
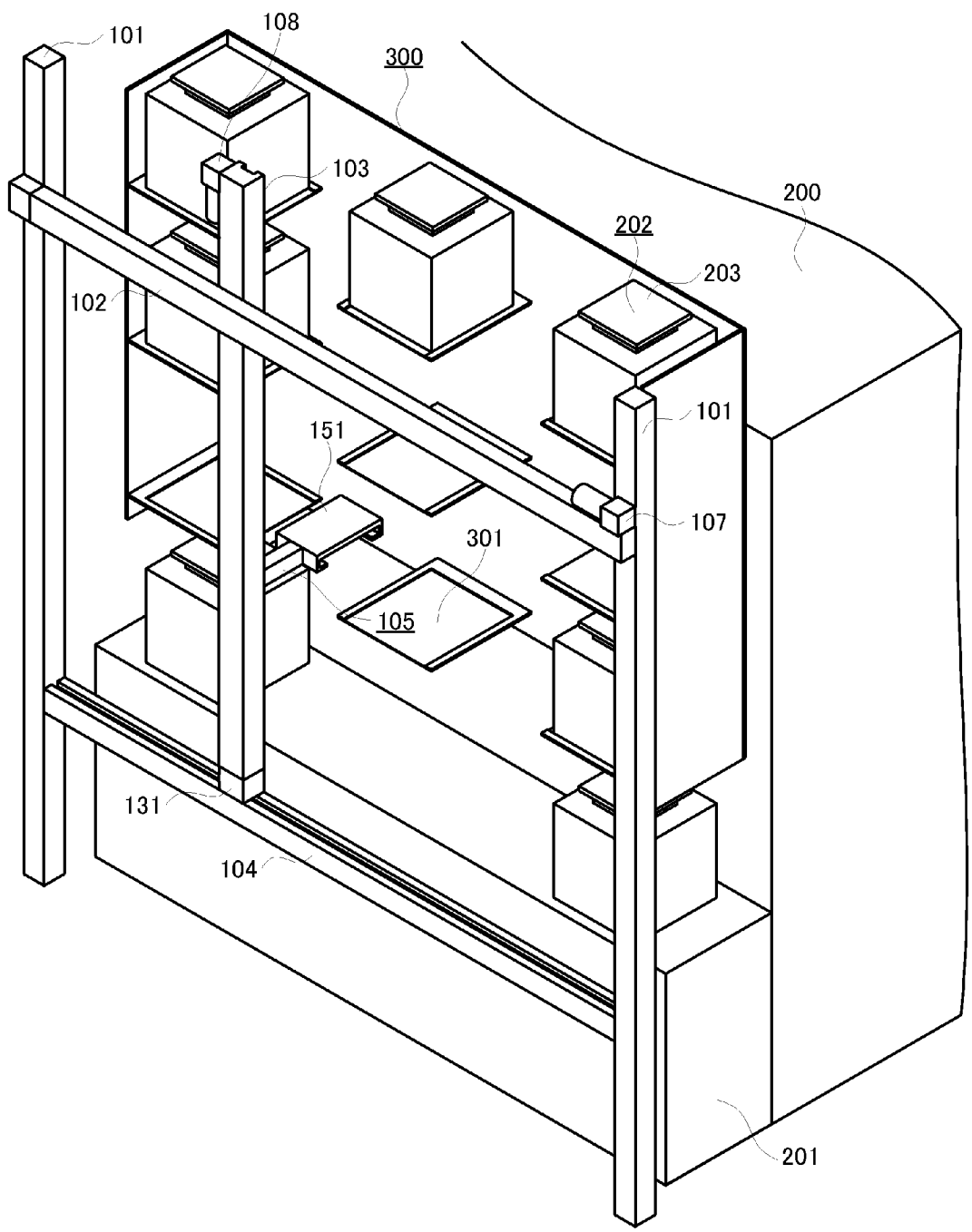
FIG. 2 depicts a perspective view showing the transfer device with a cover removed.

FIG. 2 depicts a perspective view showing the transfer device without a cover.

As shown in the drawings, a transfer device 100 is provided in front of a device 200, such as a semiconductor manufacturing device, and a loader and unloader 201, and transfers an object 202 from one of a plurality of shelf plates 301 to another one of the shelf plates 301. Here, the shelf plates 301 preferably are vertically and horizontally arranged, and provided to a shelf 300. The transfer device 100 includes pillars 101, an upper rail 102, a vertical rail 103, a lower rail 104, a holding unit 105, a cover 106, a horizontal driving unit 107, and a vertical driving unit 108.

The pillars 101 vertically stand in front of the shelf 300. In the present preferred embodiment, the pillars 101 are arranged such that a space therebetween is slightly wider than the width of the device 200, and arranged so that a plane located between the two pillars is parallel or substantially parallel with the front surface of the device 200.

The upper rail 102 is horizontally attached to the upper front surfaces of the two pillars 101 in order to tie the pillars 101 together. In the present preferred embodiment, the upper rail 102 includes an endless belt used to horizontally drive the vertical rail 103.

The vertical rail 103 is vertically provided in the plane including the two pillars 101, and is slidably attached to a side surface of the upper rail 102. The vertical rail 103 and the upper rail 102 are arranged so that they overlap with each other in a front-back direction.

The lower rail 104 is provided in a plane formed in phantom between the two pillars 101. The lower rail 104 is provided under the vertical rail 103, and sandwiched between the two pillars 101 to tie the pillars 101 together such that both ends of the lower rail 104 abut lower portions of the two pillars 101. Moreover, the lower rail 104 is attached to the vertical rail 103 in a manner which allows the vertical rail 103 to slide. In other words, the lower rail 104 and the vertical rail 103 are provided in the same plane, and the vertical rail 103 moves in the plane.

In the present preferred embodiment, the lower rail 104 and the vertical rail 103 are connected to each other via a pulley case 131. The pulley case 131 is fixed to the vertical rail 103. Thus, the pulley case 131 and the vertical rail 103 move together in a direction where the lower rail 104 extends. It is noted that in the case where the pulley case 131 has insufficient stiffness, a bracket may be provided to connect the vertical rail 103 with the lower rail 104, bypassing the pulley case 131.

The holding unit 105 detachably holds the object 202. The holding unit 105 projects from the vertical rail 103 to the shelf 300, and is slidably connected to a side surface of the vertical rail 103.

In the present preferred embodiment, a flange 203 is provided on an upper portion of the object 202 to hold the object 202. The holding unit 105 horizontally moves to hold and release the flange 203. The holding unit 105 includes a hook 151. When the flange is inserted into the hook 151, the hook catches the bottom surface of the flange 203 and lifts the object 202.

The horizontal driving unit 107 is attached to an end of the upper rail 102, and horizontally drives the vertical rail 103. In the present preferred embodiment, the horizontal driving unit 107 drives the endless belt, included in the upper rail 102, in a forward direction and a backward direction. Hence, the vertical rail 103 attached to the endless belt horizontally moves, being guided by the upper rail 102 and the lower rail 104.

It is noted that the horizontal driving unit 107 preferably is not attached to the lower rail 104. This is because the lower space in front of the transfer device 100 is preferably kept wide. Hence, as long as the lower space is not affected, a small driving unit may be attached to the lower rail 104.

The vertical driving unit 108 is attached to a side surface at the upper end of the vertical rail 103, and vertically drives the holding unit 105. In the present preferred embodiment, similar to the upper rail 102, the vertical driving unit 108 drives an endless belt, attached to the vertical rail 103, in a forward direction and a backward direction. Hence, the holding unit 105 attached to the endless belt is guided by the vertical rail 103, and vertically moves.

In the present preferred embodiment, the upper rail 102 is preferably provided below the vertical driving unit 108. Thus, when the vertical driving unit 108 moves together with the vertical rail 103, the vertical driving unit 108 and the upper rail 102 do not interfere with each other.

The cover 106 is a wall-shaped member which separates the user and the transfer device 100 when the transfer device 100 is running. The cover 106 is provided in front of the two pillars 101 to cover the entire moving area of the holding unit 105. The cover 106 preferably includes an upper cover 161 which (i) projects forward to cover the upper rail 102 located in the upper moving area and (ii) extends along the upper rail 102; and a lower cover 163 which (i) is provided behind the upper cover 161 and (ii) covers the lower portion of the lower part of the moving area. In the present preferred embodiment, the lower cover 163 preferably includes three doors 162. The user opens the doors 162 to reach the transfer device 100 and the loader and unloader 201.

The shelf 300 is provided above the loader and unloader 201, and temporarily stores an object 202 received from an overhead transferring vehicle and another object 202 to be transferred to an overhead transferring vehicle. In other words, the shelf 300 acts as a buffer for the objects 202 provided near a machine. In the present preferred embodiment, the shelf 300 preferably includes three columns of the shelf plates 301, and each column preferably includes three shelf plates 301 vertically arranged. Thus, the shelf 300 can store nine objects 202 in total. Furthermore, the shelf 300 includes an aisle vertically extending between the shelf plates 301. This structure allows the object 202 to be vertically moved in the shelf 300.

Furthermore, a space is provided between the shelf 300 and the loader and unloader 201, so that the object 202 can be horizontally moved through the space. Thus, the shelf 300 allows the transfer device 100 to freely transfer the object 202 inside the shelf 300.

The loader and unloader 201 is a device which brings to the device 200 a substrate contained in the object 202, and puts a processed substrate into the object 202 and carries the object 202. In the present preferred embodiment, the loader and unloader 201 also works as the shelf 300 to temporarily store the object 202.

Figure 3:
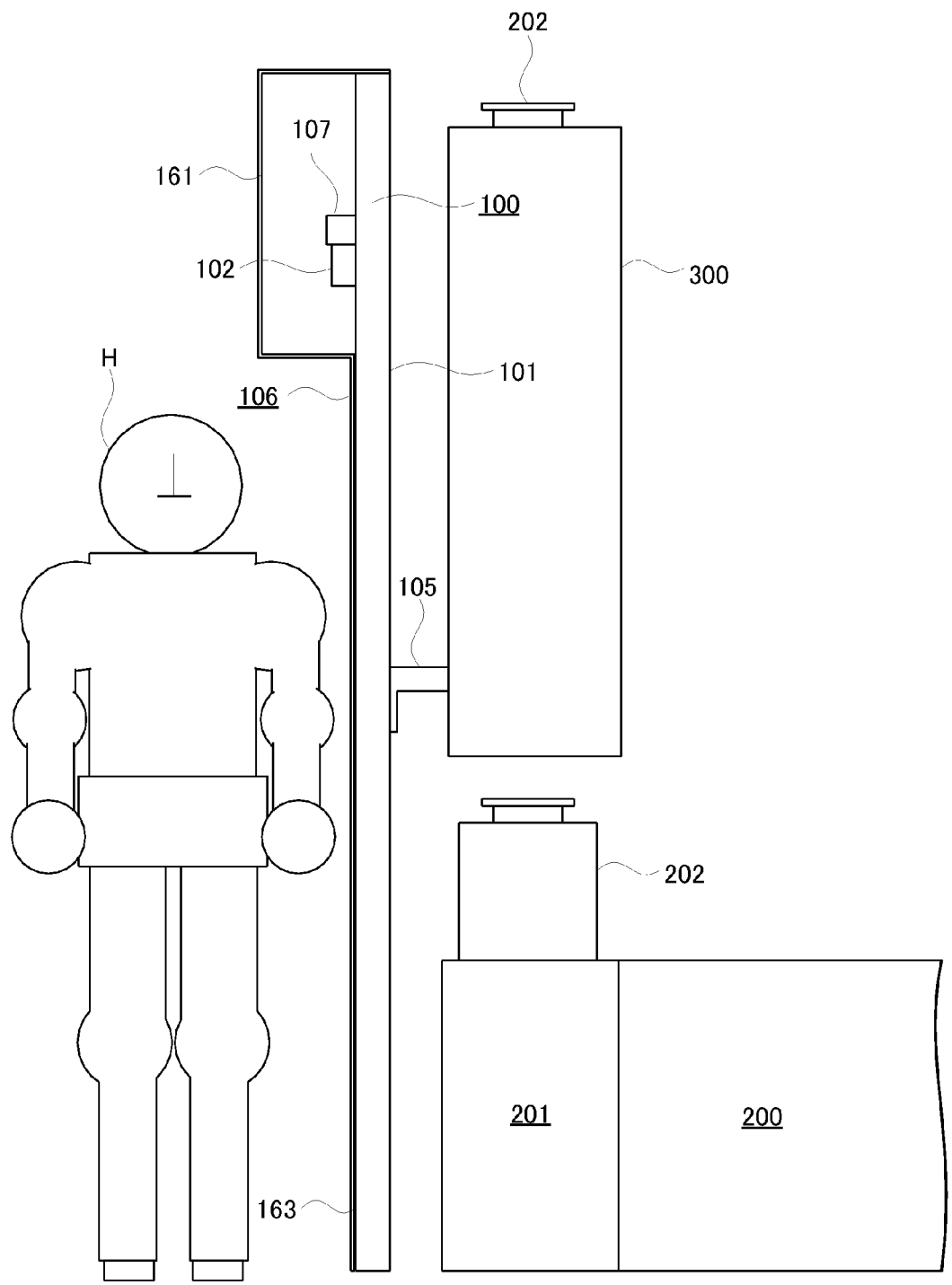
FIG. 3 depicts a plan view showing the transfer device and a user from the side.

FIG. 3 depicts a plan view showing the transfer device and the user from the side.

The transfer device 100 described above includes the upper rail 102 and the lower rail 104 horizontally provided. In addition to the high stiffness, the transfer device 100 includes forward-projecting (on the left of FIG. 3) portions concentrated in its upper area. Such a structure allows the transfer device 100 to maintain a desired width for a user H and a vehicle to travel. In other words, the transfer device 100 can keep the aisle width substantially wide.

Furthermore, the vertical driving unit 108 preferably is not provided above the pillars 101, and does not interfere with the upper rail 102. This structure can keep a space wide over the entire or substantially the entire transfer device 100. Hence, even though an overhead traveling vehicle is provided over the device 200, this structure successfully prevents interference of the transfer device 100 with the overhead traveling vehicle.

Figure 4:
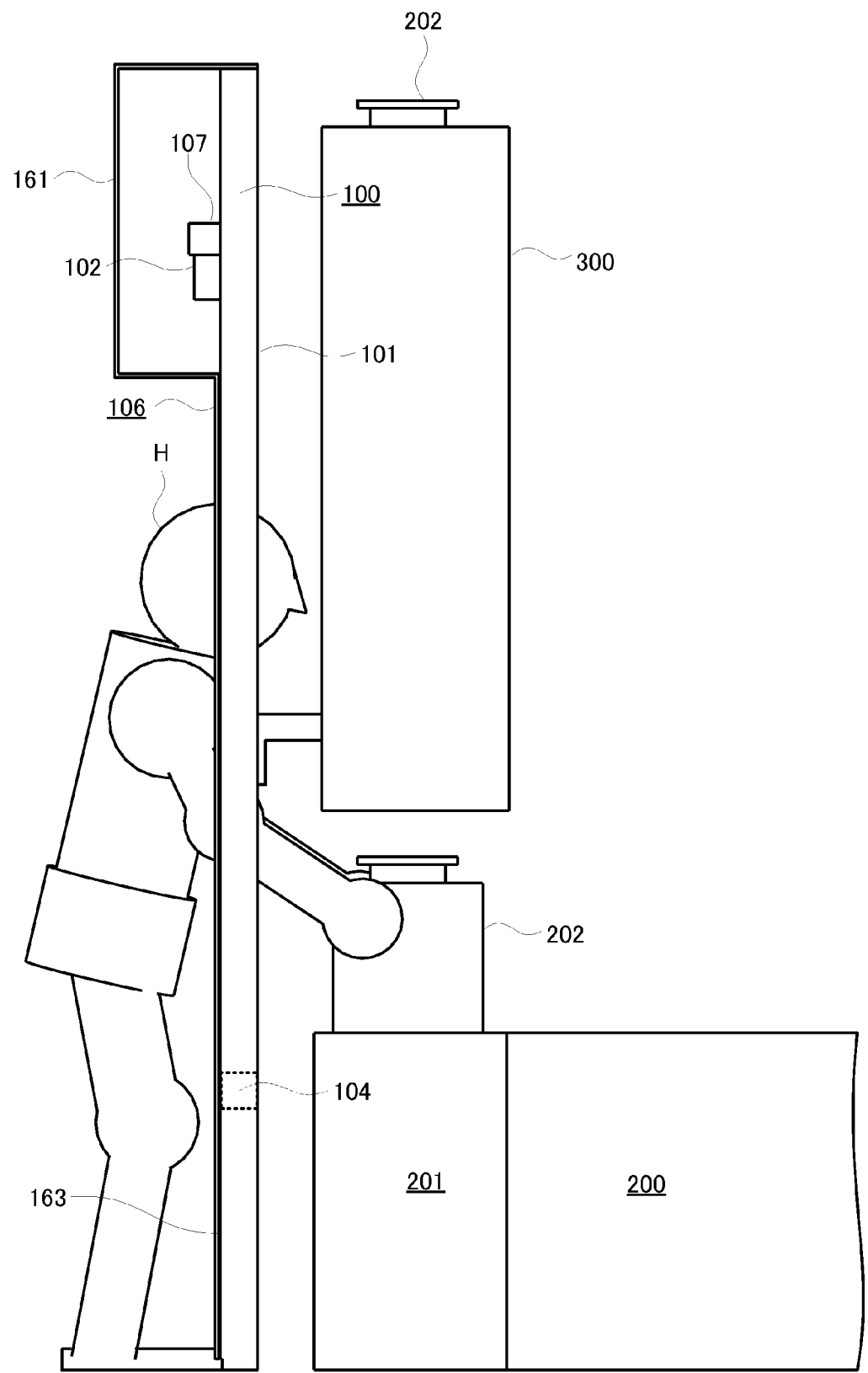
FIG. 4 is a plan view showing from the side how the user opens a door and reaches an object.

FIG. 4 is a plan view showing from the side how the user opens a door and reaches an object.

As shown in FIG. 4, suppose the case where the transfer device 100 is out of service, and the user H opens the doors 162 on the cover 106 to reach an object 202 stored on the loader and unloader 201. Even in such a case, the user H is not bothered by the lower rail 104, and can easily reach the object 202. This is because the lower rail 104 is provided to a relatively lower portion of the transfer device 100, and does not project forward of the pillars 101.

It is noted that the present invention is not limited to the above preferred embodiment. For example, instead of catching the flange 203 provided on an upper portion of the object 202 and transferring the object 202 with the object suspended, the holding unit 105 may include a hook to be inserted into a lower portion of the object 202 and to lift the object 202. The shelf 300 can store the objects 202 three high and three wide, for example. The loader and unloader 201 according to the above-described preferred embodiment also stores the objects 202. Consequently, the loader and unloader 201 is a part of the shelf 300.

Any given combination of the constitutional features described in the specification may be appreciated to implement a preferred embodiment of the present invention other than the above described preferred embodiment. Although exemplary preferred embodiments of the present invention have been described in detail above, those skilled in the art will readily appreciate that many modifications are possible to the exemplary preferred embodiments without materially departing from the novel aspects of the present invention. Accordingly, all such modifications are intended to be included within the scope of the present invention.

The words such as "vertical", "plane", and "parallel" are used within a margin of error without departing from the intents of the present invention. Moreover, the word "loader and unloader" describes a device which is capable of either (i) one of bringing in and carrying out an object, or (ii) both bringing in and carrying out of an object.

Preferred embodiments of the present invention are applicable to an automated shelf for a machine placed near a semiconductor manufacturing device, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transfer device which transfers an object stored on one of a plurality of shelf plates to another one of the plurality of shelf plates, the plurality of shelf plates being arranged vertically and horizontally on a shelf, the transfer device comprising:
   at least two pillars arranged to vertically stand in front of the shelf;
   an upper rail which is horizontally attached to upper front exterior surfaces of the at least two pillars so as to tie the at least two pillars together;
   a vertical rail which is vertically and slidably connected to a side surface of the upper rail;
   a lower rail which is provided under the vertical rail, sandwiched between the at least two pillars to tie the at least two pillars together such that both ends of the lower rail abut lower portions of the at least two pillars, and connected to the vertical rail so as to allow the vertical rail to slide; and
   a holding unit which projects from the vertical rail to the shelf and is slidably connected to a side surface of the vertical rail, and configured to detachably hold the object; wherein
   the vertical rail, the lower rail, and the at least two pillars are arranged in a same plane formed in phantom between the at least two pillars;
   the upper rail is located outside of the plane and arranged in parallel with the plane; and
   the vertical rail is arranged to move in the plane.

2. The transfer device according to claim 1, further comprising a cover which is provided in front of the at least two pillars and covers a moving area of the holding unit, wherein the cover includes an upper cover which covers the upper rail, and a lower cover which is provided behind the upper cover and covers a lower portion of the moving area.

3. The transfer device according to claim 1, wherein the upper rail includes a horizontal driving unit which is attached to an end of the upper rail and configured to horizontally drive the vertical rail, and the lower rail does not include the horizontal driving unit.

4. The transfer device according to claim 1, wherein the vertical rail includes a vertical driving unit which is attached to a side surface at an upper end of the vertical rail and configured to vertically drive the holding unit, and the upper rail is provided below the vertical driving unit.

5. The transfer device according to claim 1, wherein the vertical rail is connected to a rear surface of the upper rail.

6. The transfer device according to claim 1, wherein the vertical rail is arranged between the upper rail and the shelf.

7. The transfer device according to claim 1, wherein the vertical rail is arranged between the upper rail and the shelf.

8. The transfer device according to claim 2, wherein the transfer device is arranged between the shelf and the cover.

9. The transfer device according to claim 2, wherein the lower cover includes at least one door that is openable by a user to provide access to the transfer device.

* * * * *